United States Patent
Moon

(10) Patent No.: US 9,324,385 B2
(45) Date of Patent: Apr. 26, 2016

(54) SEMICONDUCTOR DEVICE FOR GENERATING INITIALIZATION OF INFORMATION IN RESPONSE TO A FIRST CLOCK AND OUTPUTTING THE INITIALIZATION INFORMATION IN RESPONSE TO A SECOND CLOCK

(75) Inventor: Jinyeong Moon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 441 days.

(21) Appl. No.: 13/448,596

(22) Filed: Apr. 17, 2012

(65) Prior Publication Data

US 2013/0166940 A1 Jun. 27, 2013

(30) Foreign Application Priority Data

Dec. 21, 2011 (KR) ........................ 10-2011-0139545

(51) Int. Cl.
| | |
|---|---|
| *G06F 1/00* | (2006.01) |
| *G11C 7/10* | (2006.01) |
| *G11C 19/20* | (2006.01) |
| *G11C 7/20* | (2006.01) |
| *G11C 11/4072* | (2006.01) |

(52) U.S. Cl.
CPC ............ *G11C 7/1021* (2013.01); *G11C 7/1039* (2013.01); *G11C 7/20* (2013.01); *G11C 11/4072* (2013.01)

(58) Field of Classification Search
CPC ........ G06F 1/08; G11C 7/1021; G11C 7/1039; G11C 7/20; G11C 7/4072
USPC ............................................. 713/500
See application file for complete search history.

(56) References Cited

U.S. PATENT DOCUMENTS

| | | | |
|---|---|---|---|
| 2003/0217225 A1* | 11/2003 | Jang et al. ...................... 711/105 |
| 2008/0052482 A1 | 2/2008 | Choi et al. |
| 2008/0056028 A1* | 3/2008 | Lee ................................ 365/193 |
| 2008/0163036 A1 | 7/2008 | Kim |
| 2010/0001762 A1* | 1/2010 | Kim ................................ 326/93 |
| 2011/0216606 A1* | 9/2011 | Kim et al. ................. 365/189.05 |

FOREIGN PATENT DOCUMENTS

KR 1020100032571 3/2010

* cited by examiner

*Primary Examiner* — Robert Cassity
(74) *Attorney, Agent, or Firm* — IP & T Group LLP

(57) ABSTRACT

A semiconductor device includes an initialization information generation unit configured to operate in response to a first clock and generate first initialization information having a value that is adjusted according to a value of an address signal that corresponds to output data, a domain crossing unit configured to receive the first initialization information in response to the first clock and output the first initialization information as second initialization information by outputting the second initialization information in response to a second clock, and a pulse generation unit configured to operate in response to the second clock and adjust a toggling point in time of a control pulse in response to the second initialization information.

15 Claims, 2 Drawing Sheets

SEMICONDUCTOR DEVICE FOR GENERATING INITIALIZATION OF INFORMATION IN RESPONSE TO A FIRST CLOCK AND OUTPUTTING THE INITIALIZATION INFORMATION IN RESPONSE TO A SECOND CLOCK

CROSS-REFERENCE TO RELATED APPLICATIONS

The present application claims priority of Korean Patent Application No. 10-2011-0139545, filed on Dec. 21, 2011, which is incorporated herein by reference in its entirety.

BACKGROUND

1. Field

Exemplary embodiments of the present invention relate to a semiconductor design technology, and more particularly, to a burst ordering operation of a semiconductor device.

2. Description of the Related Art

In general, a semiconductor memory element such as a double data rate synchronous DRAM (DDR SDRAM) receives various commands in synchronization with an external clock, operates in synchronization with an internal clock, and outputs data as a result of memory operations.

As described above, when the semiconductor memory element outputs data, a burst ordering operation may be performed for a critical word first (CWF) operation.

The burst ordering operation represents an operation for designating an output order of data to be output corresponding to the size of a burst length of a semiconductor device.

SUMMARY

An embodiment of the present invention is directed to a semiconductor device that supports a burst ordering operation.

In accordance with an embodiment of the present invention, a semiconductor device includes: an initialization information generation unit configured to operate in response to a first clock and generate first initialization information having a value that is adjusted according to a value of an address signal that corresponds to output data; a domain crossing unit configured to receive the first initialization information in response to the first clock and output the first initialization information as second initialization information by outputting the second initialization information in response to a second clock; and a pulse generation unit configured to operate in response to the second clock and adjust a toggling point in time of a control pulse in response to the second initialization information.

In accordance with another embodiment of the present invention, a semiconductor device includes: an initialization information generation unit configured to operate in response to a first clock and generate a plurality of first initialization information signals having values that are adjusted according to values of a plurality of address signals that correspond to a plurality of output data signals; a domain crossing unit configured to receive the plurality of first initialization information signals in response to the first clock as a plurality of second initialization information signals by outputting the plurality of second initialization information signals in response to a second clock; and a pulse generation unit configured to operate in response to the second clock and adjust a plurality of control pulses to be toggled at different points in time in response to the plurality of second initialization information signals.

In accordance with further another embodiment of the present invention, a method for operating a semiconductor device includes: generating first initialization information having a value that is adjusted according to a value of an address signal that corresponds to output data and is generated in response to a first clock; outputting the first initialization information as second initialization information by synchronizing the first initialization information with a second clock; and generating a control pulse having a toggling point in time to be adjusted in response to the second initialization information and the second clock.

DETAILED DESCRIPTION

Figure 1:
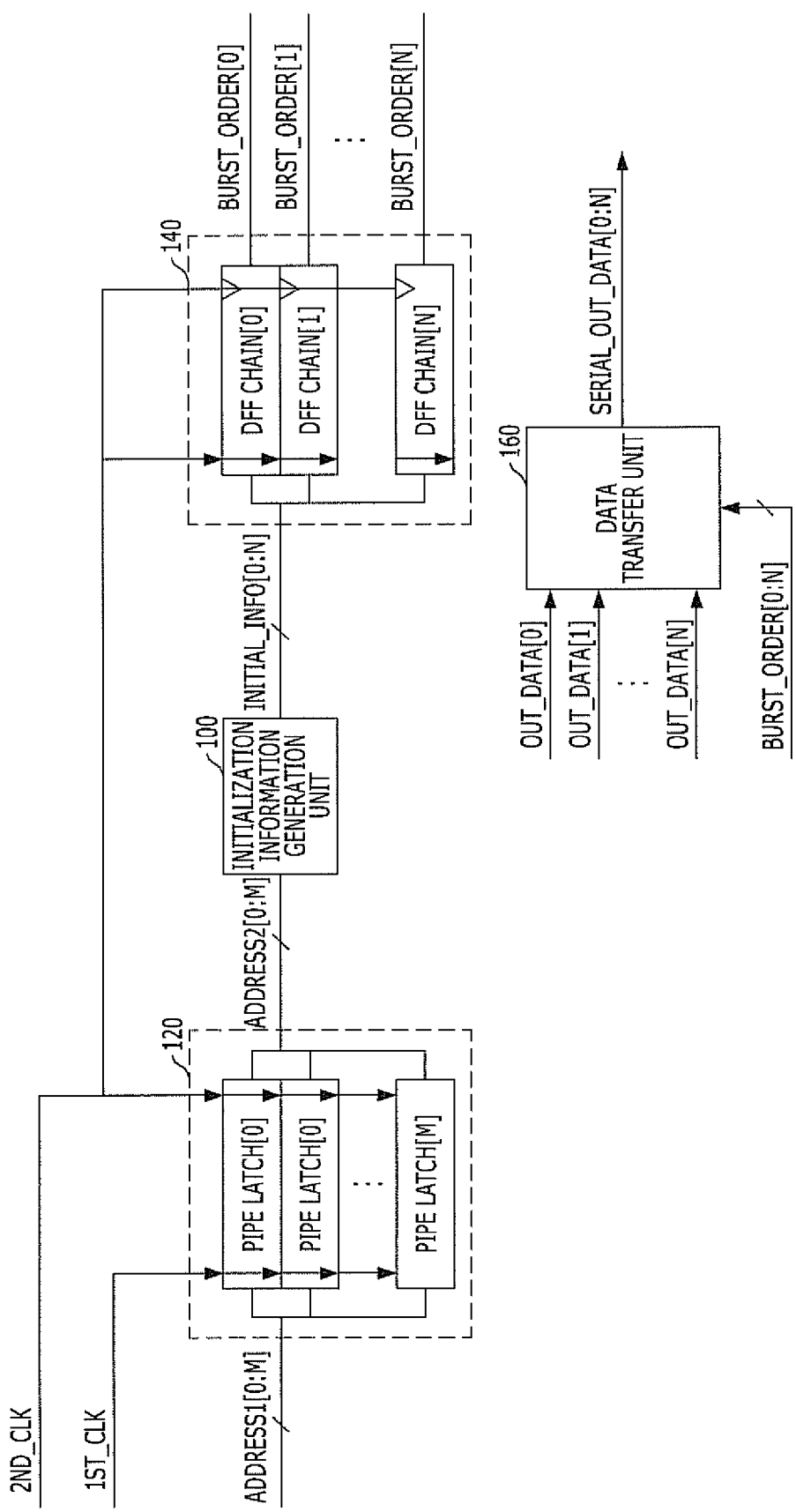
FIG. 1 is a block diagram illustrating the configuration of a semiconductor device that supports a burst ordering operation.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating the configuration of a semiconductor device that supports a burst ordering operation.

Referring to FIG. 1, the semiconductor device includes a domain crossing unit 120, an initialization information generation unit 100, a pulse generation unit 140, and a data transfer unit 160.

A first clock 1ST_CLK is a clock obtained by delaying an external system clock by an internal setting operation, and a second clock 2ND_CLK is an internal clock set to have an edge substantially the same as that of the external system clock.

More specifically, the first clock 1ST_CLK is a clock obtained by delaying the external system clock by a delay amount set by an internal operation of the semiconductor device, and the edge of the first clock 1ST_CLK is substantially formed at a point in time different from that of the external system clock. However, the second clock 2ND_CLK may be generated in the semiconductor device or input from a circuit outside of the semiconductor device such that the edge of the second clock 2ND_CLK is formed at a point in time substantially the same as that of the external system clock. A representative example of the second clock 2ND_CLK may be a delay-locked loop (DLL).

The domain crossing unit 120 is configured to synchronize a plurality of first address signals ADDRESS1[0:M] with the second clock 2ND_CLK and output a plurality of second address signals ADDRESS2[0:M]. For example, the first address signals ADDRESS1[0:M] may correspond to a plurality of output data signals OUT_DATA[0:N] and are applied in synchronization with the first clock 1ST_CLK.

In detail, the domain crossing unit 120 includes a plurality of pipe latches PIPE LATCH[0:M], and the plurality of first address signals ADDRESS1[0:M] are applied to the plurality of pipe latches PIPE LATCH[0:M] when the first clock 1ST_CLK is toggled. The plurality of first address signals ADDRESS1[0:M] input into the plurality of pipe latches PIPE LATCH[0:M] are latched and subsequently are output from the plurality of pipe latches PIPE LATCH[0:M] as the plurality of second address signals ADDRESS2[0:M] when the second clock 2ND_CLK is toggled.

The operation of the domain crossing unit 120 as described above is performed so that the plurality of first address signals ADDRESS1[0:M] belonging to the domain of the first clock 1ST_CLK may be output as the plurality of second address signals ADDRESS2[0:M] belonging to the domain of the second clock 2ND_CLK through the domain crossing unit 120.

The initialization information generation unit 100 is configured to generate a plurality of initialization information signals INITIAL_INFO[0:N] having values that are adjusted according to the values of the plurality of second address signals ADDRESS2[0:M].

In detail, the initialization information generation unit 100 is configured to perform a plurality of operations on the plurality of second address signals ADDRESS2[0:M] and generate the plurality of initialization information signals INITIAL_INFO[0:N].

For example, the initialization information generation unit 100 is configured to perform an AND operation on a value of a signal ADDRESS2[0]#, which is a signal obtained by inverting the first address signal ADDRESS2[0] of the plurality of second address signals ADDRESS2[0:M], and a value of a signal ADDRESS2[1]#, which is a signal obtained by inverting the second address signal ADDRESS2[1] of the plurality of second address signals ADDRESS2[0:M], to determine the value of the first initialization information signal INITIAL_INFO[0] of the plurality of initialization information signals INITIAL_INFO[0:N]. Furthermore, the initialization information generation unit 100 is configured to perform an AND operation on the value of the first address signal ADDRESS2[0] of the plurality of second address signals ADDRESS2[0:M] and the value of the signal ADDRESS2[1]# to determine the value of the second initialization information signal INITIAL_INFO[1] of the plurality of initialization information signals INITIAL_INFO[0:N]. Furthermore, the initialization information generation unit 100 is configured to perform an AND operation on the value of the signal ADDRESS2[0]# and the value of the second address signal ADDRESS2[1] to determine the value of the third initialization information signal INITIAL_INFO[2] of the plurality of initialization information signals INITIAL_INFO[0:N]. Furthermore, the initialization information generation unit 100 is configured to perform an AND operation on the value of the first address signal ADDRESS2[0] of the plurality of second address signals ADDRESS2[0:M] and the value of the second address signal ADDRESS2[1] to determine the value of the fourth initialization information signal INITIAL_INFO[3] of the plurality of initialization information signals INITIAL_INFO[0:N].

The pulse generation unit 140 is configured to operate in response to the second clock 2ND_CLK and control a plurality of burst ordering pulses BURST_ORDER[0:N] to be toggled at different points in time in response to the plurality of initialization information signals INITIAL_INFO[0:N].

In detail, the pulse generation unit 140 includes a plurality of pulse output sections DFF CHAIN[0:N]. The plurality of pulse output sections DFF CHAIN[0:N] each includes a plurality of flip-flops connected in chain form, and each operates in response to the second clock 2ND_CLK. In each of the pulse output sections DFF CHAIN[0:N], one of the plurality of flip-flops outputs one of the plurality of burst ordering pulses BURST_ORDER[0:N] in response to one of the plurality of initialization information signals INITIAL_INFO[0:N].

For example, among the plurality of pulse output sections DFF CHAIN[0:N], the first pulse output section DFF CHAIN[0] outputs the first burst ordering pulse BURST_ORDER[0] of the plurality of burst ordering pulses BURST_ORDER[0:N] in response to the first initialization information signal INITIAL_INFO[0] of the plurality of initialization information signals INITIAL_INFO[0:N]. Furthermore, the third pulse output section DFF CHAIN[2] outputs the third burst ordering pulse BURST_ORDER[2] of the plurality of burst ordering pulses BURST_ORDER[0:N] in response to the third initialization information signal INITIAL_INFO[2] of the plurality of initialization information signals INITIAL_INFO[0:N]. Furthermore, the sixth pulse output section DFF CHAIN[5] outputs the sixth burst ordering pulse BURST_ORDER[5] of the plurality of burst ordering pulses BURST_ORDER[0:N] in response to the sixth initialization information signal INITIAL_INFO[5] of the plurality of initialization information signals INITIAL_INFO[0:N].

Furthermore, among the plurality of flip-flops included in each of the pulse output sections DFF CHAIN[0:N], the number of the flip-flops operating may be changed according to a burst option representing a burst length (BL) or burst chop value.

For example, when the burst length (BL) or burst chop value is 8, 8 flip-flops of the plurality of flip-flops included in each of the pulse output sections DFF CHAIN[0:N] are sequentially used for an operation that generates the plurality of burst ordering pulses BURST_ORDER[0:N], and the other flip-flops included in each of the pulse output sections DFF CHAIN[0:N] are not used. Accordingly, 8 is the maximum number of the plurality of output data signals OUT_DATA[0:N], and the order of the plurality of output data signals OUT_DATA[0:N] may be determined through the plurality of burst ordering pulses BURST_ORDER[0:N]. Similarly, when the burst length (BL) or burst chop value is 4, 4 flip-flops of the flip-flops included in each of the pulse output sections DFF CHAIN[0:N] are sequentially used for an operation that generates the plurality of burst ordering pulses BURST_ORDER[0:N], and the other flip-flops included in each of the pulse output sections DFF CHAIN[0:N] are not used. Accordingly, 4 is the maximum number of the plurality of output data signals OUT_DATA[0:N], and the order of the plurality of output data signals OUT_DATA[0:N] may be determined through the plurality of burst ordering pulses BURST_ORDER[0:N].

The toggling timings of the plurality of burst ordering pulses BURST_ORDER[0:N] generated as described above may be adjusted according to the plurality of initialization information signals INITIAL_INFO[0:N].

For example, the first burst ordering pulse BURST_ORDER[0] may be toggled before or after the third burst ordering pulse BURST_ORDER[2] in response to the value of the first initialization information signal INITIAL_INFO[0] or the third initialization information signal INITIAL_INFO[2]. Furthermore, the first burst ordering pulse BURST_ORDER[0] may be toggled before or after the sixth burst ordering pulse BURST_ORDER[5] in response to the value of the first initialization information signal INITIAL_INFO[0] or the sixth initialization information signal INITIAL_INFO[5]. Furthermore, the third burst ordering pulse BURST_ORDER[2] may be toggled before or after the sixth burst ordering pulse BURST_ORDER[5] in response to the value of the third initialization information signal INITIAL_INFO[2] or the sixth initialization information signal INITIAL_INFO[5].

Accordingly, an operation for adjusting the values of the plurality of initialization information signals INITIAL_INFO[0:N] is performed so that the points in time when the plurality of burst ordering pulses BURST_ORDER[0:N] are toggled may be adjusted, and the operation for adjusting the values of the plurality of second initialization information signals INITIAL_INFO2[0:N] is performed to set an operation for designating the output order of data to be output corresponding to the size of the burst length of the semiconductor device.

In the semiconductor device that supports the burst ordering operation as illustrated in FIG. 1, the plurality of second address signals ADDRESS2[0:M] output from the domain crossing unit 120 and the plurality of initialization information signals INITIAL_INFO[0:N] applied to the data transfer unit 160 operate in response to the second clock 2ND_CLK.

In addition, the data transfer unit 160 may normally operate, for example, only when the values of the plurality of initialization information signals INITIAL_INFO[0:N] have been fixed before the data transfer unit 160 starts to operate in response to the second clock 2ND_CLK.

More specifically, even though a margin does not approximately exist from a point in time when the domain crossing unit 120 outputs the plurality of second address signals ADDRESS2[0:M] in response to the second clock 2ND_CLK until a point in time when the data transfer unit 160 starts to operate in response to the second clock 2ND_CLK, the operation of the initialization information generation unit 100 is to be completed between the domain crossing unit 120 output point in time and the data transfer unit 160 operation point in time.

Of course, since the plurality of operations performed by the initialization information generation unit 100 are simple, the operations may be performed at a high speed. However, as an operation margin between the domain crossing unit 120 and the data transfer unit 160 is reduced due to a high speed operation or a low voltage operation of the semiconductor device or a variation in PVT (process, voltage, and temperature), the data transfer unit 160 may abnormally operate due to the operation time of the initialization information generation unit 100.

Figure 2:
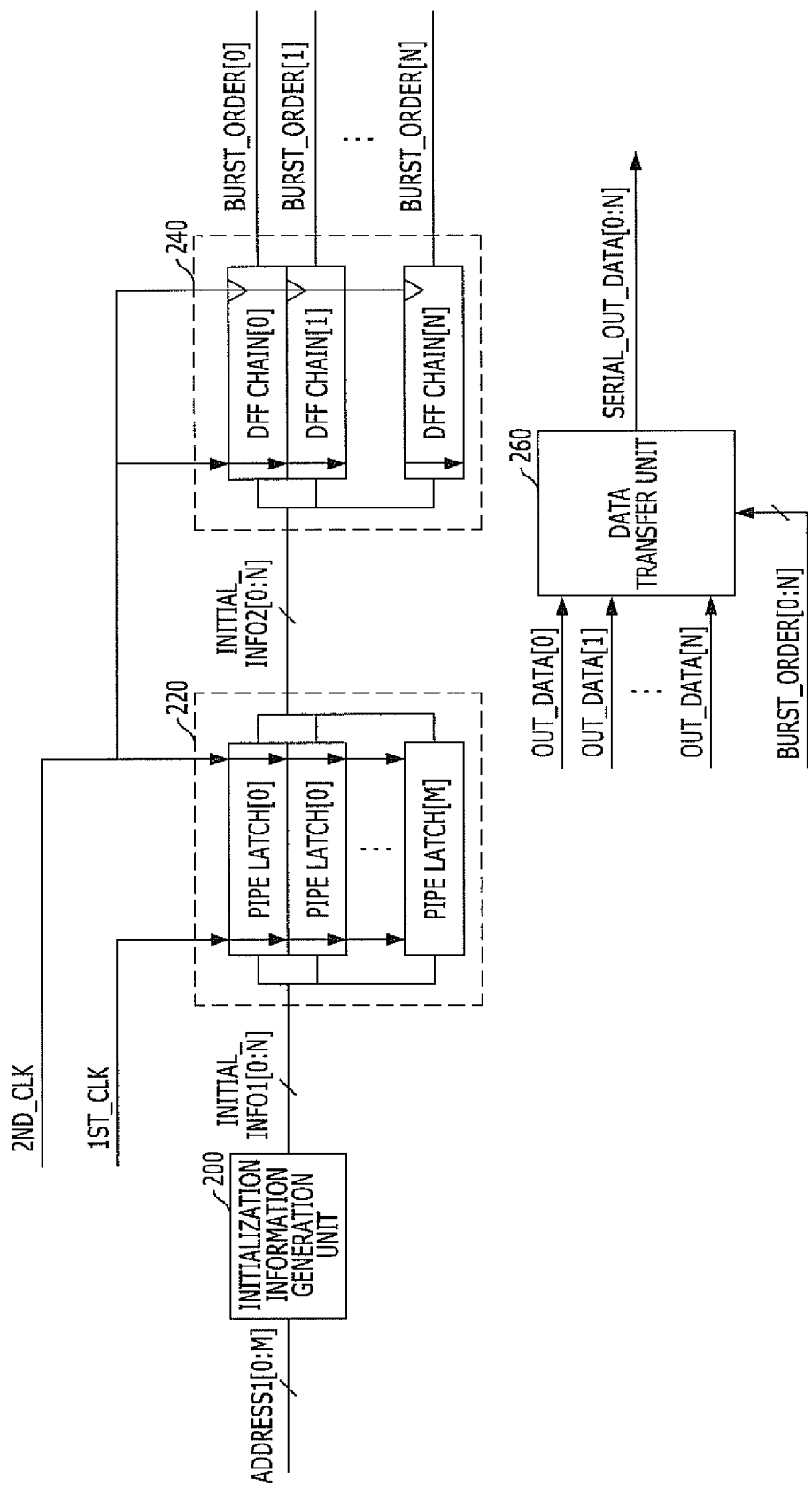
FIG. 2 is a block diagram illustrating the configuration of a semiconductor device that supports a burst ordering operation regardless of a variation in PVT (process, voltage, and temperature).

FIG. 2 is a block diagram illustrating the configuration of a semiconductor device that supports the burst ordering operation regardless of a variation in PVT (process, voltage, and temperature).

Referring to FIG. 2, the semiconductor device that supports the burst ordering operation regardless of a variation in PVT (process, voltage, and temperature) includes an initialization information generation unit 200, a domain crossing unit 220, a pulse generation unit 240, and a data transfer unit 260.

A first clock 1ST_CLK is a clock obtained by delaying an external system clock by an internal setting operation, and a second clock 2ND_CLK is an internal clock set to have an edge substantially the same as that of the external system clock.

More specifically, the first clock 1ST_CLK is a clock obtained by delaying the external system clock by a delay amount set by an internal operation of the semiconductor device, and the edge of the first clock 1ST_CLK is formed at a point in time different from that of the external system clock. However, the second clock 2ND_CLK may be generated in the semiconductor device or input from a circuit outside of the semiconductor device such that the edge of the second clock 2ND_CLK is formed at a point in time substantially the same as that of the external system clock. A representative example of the second clock 2ND_CLK may be a delay-locked loop (DLL).

The initialization information generation unit 200 is configured to generate a plurality of first initialization information signals INITIAL_INFO1[0:N] having values that are adjusted according to the values of a plurality of address signals ADDRESS[0:M], which correspond to a plurality of output data signals OUT_DATA[0:N] and are applied in synchronization with the first clock 1ST_CLK In detail, the initialization information generation unit 200 is configured to perform a plurality of operations on the plurality of address signals ADDRESS[0:M] and generate the plurality of first initialization information signals INITIAL_INFO1[0:N].

For example, the initialization information generation unit 200 is configured to perform an AND operation on a value ADDRESS[0]#, which is a signal obtained by inverting the first address signal ADDRESS[0] of the plurality of address signals ADDRESS[0:M], and a signal ADDRESS[1]#, which is a signal obtained by inverting the second address signal ADDRESS[1] of the plurality of second address signals ADDRESS[0:M], to determine the value of the first initialization information signal INITIAL_INFO1[0] of the plurality of first initialization information signals INITIAL_INFO1[0:N]. Furthermore, the initialization information generation unit 200 is configured to perform an AND operation on the value of the first address signal ADDRESS[0], and the value of the signal ADDRESS[1]# to determine the value of the second initialization information signal INITIAL_INFO1[1] of the plurality of first initialization information signals INITIAL_INFO1[0:N]. Furthermore, the initialization information generation unit 200 is configured to perform an AND operation on the value of the signal ADDRESS[0]# and the value of the second address signal ADDRESS[1] to determine the value of the third initialization information signal INITIAL_INFO1[2] of the plurality of first initialization information signals INITIAL_INFO1[0:N]. Furthermore, the initialization information generation unit 200 is configured to perform an AND operation on the value of the first address signal ADDRESS[0] and the value of the second address signal ADDRESS[1] to determine the value of the fourth initialization information signal INITIAL_INFO1[3] of the plurality of first initialization information signals INITIAL_INFO1[0:N].

The domain crossing unit 220 is configured to output the plurality of first initialization information signals INITIAL_INFO1[0:N] as a plurality of second initialization information signals INITIAL_INFO2[0:N] through crossing the first initialization information signals INITIAL_INFO1[0:N] into the domain of the second clock 2ND_CLK.

In detail, the domain crossing unit 220 includes a plurality of pipe latches PIPE LATCH[0:M], and the plurality of first initialization information signals INITIAL_INFO1[0:N] are applied to the plurality of pipe latches PIPE LATCH[0:M] when the first clock 1ST_CLK is toggled. The plurality of first initialization information signals INITIAL_INFO1[0:N] input to the plurality of pipe latches PIPE LATCH[0:M] are latched and subsequently are output from the plurality of pipe latches PIPE LATCH[0:M] as the plurality of second initialization information signals INITIAL_INFO2[0:N] when the second clock 2ND_CLK is toggled.

The operation of the domain crossing unit 220 as described above is performed so that the plurality of first initialization information signals INITIAL_INFO1[0:N] belonging to the domain of the first clock 1ST_CLK may be output as the plurality of second initialization information signals INITIAL_INFO2[0:N] belonging to the domain of the second clock 2ND_CLK through the domain crossing unit 220.

The pulse generation unit 240 is configured to operate in response to the second clock 2ND_CLK and control a plurality of burst ordering pulses BURST_ORDER[0:N] to be toggled at different points in time in response to the plurality of second initialization information signals INITIAL_INFO2[0:N].

In detail, the pulse generation unit 240 includes a plurality of pulse output sections DFF CHAIN[0:N]. The plurality of pulse output sections DFF CHAIN[0:N] each includes a plurality of flip-flops connected in chain form, and each operates in response to the second clock 2ND_CLK. In each of the pulse output sections DFF CHAIN[0:N], one of the plurality of flip-flops outputs one of the plurality of burst ordering pulses BURST_ORDER[0:N] in response to one of the plurality of second initialization information signals INITIAL_INFO2[0:N].

For example, among the plurality of pulse output sections DFF CHAIN[0:N], the first pulse output sections DFF CHAIN[0] outputs the first burst ordering pulse BURST_ORDER[0] of the plurality of burst ordering pulses BURST_ORDER[0:N] in response to the first initialization information signal INITIAL_INF2[0] of the plurality of second initialization information signals INITIAL_INFO2[0:N]. Furthermore, the third pulse output sections DFF CHAIN[2] outputs the third burst ordering pulse BURST_ORDER[2] of the plurality of burst ordering pulses BURST_ORDER[0:N] in response to the third initialization information signal INITIAL_INF2[2] of the plurality of second initialization information signals INITIAL_INFO2[0:N]. Furthermore, the sixth pulse output sections DFF CHAIN[5] outputs the sixth burst ordering pulse BURST_ORDER[5] of the plurality of burst ordering pulses BURST_ORDER[0:N] in response to the sixth initialization information signal INITIAL_INF2[5] of the plurality of second initialization information signals INITIAL_INFO2[0:N].

Furthermore, among the plurality of flip-flops included in each of the pulse output sections DFF CHAIN[0:N], the number of the flip-flops operating may be changed according to a burst option representing a burst length (BL) or burst chop value.

For example, when the burst length (BL) or burst chop value is 8, 8 flip-flops of the flip-flops included in each of the pulse output sections DFF CHAIN[0:N] are sequentially used for an operation that generates the plurality of burst ordering pulses BURST_ORDER[0:N], and the other flip-flops included in each of the pulse output sections DFF CHAIN[0:N] are not used. Accordingly, 8 is the maximum number of the plurality of output data signals OUT_DATA[0:N], and the order of the plurality of output data signals OUT_DATA[0:N] may be determined through the plurality of burst ordering pulses BURST_ORDER[0:N]. Similarly, when the burst length (BL) or burst chop value is 4, 4 flip-flops of the flip-flops included in each of the pulse output sections DFF CHAIN[0:N] are sequentially used for an operation that generates the plurality of burst ordering pulses BURST_ORDER[0:N], and the other flip-flops included in each of the pulse output sections DFF CHAIN[0:N] are not used. Accordingly, 4 is the maximum number of the plurality of output data signals OUT_DATA[0:N], and the order of the plurality of output data signals OUT_DATA[0:N] may be determined through the plurality of burst ordering pulses BURST_ORDER[0:N].

The toggling timings of the plurality of burst ordering pulses BURST_ORDER[0:N] generated as described above may be adjusted according to the plurality of second initialization information signals INITIAL_INFO2[0:N].

For example, the first burst ordering pulse BURST_ORDER[0] may be toggled before or after the third burst ordering pulse BURST_ORDER[2] in response to the value of the first initialization information signal INITIAL_INFO2[0] or the third initialization information signal INITIAL_INFO2[2]. Furthermore, the first burst ordering pulse BURST_ORDER[0] may be toggled before or after the sixth burst ordering pulse BURST_ORDER[5] in response to the value of the first initialization information signal INITIAL_INFO2[0] or the sixth initialization information signal INITIAL_INFO2[5]. Furthermore, the third burst ordering pulse BURST_ORDER[2] may be toggled before or after the sixth burst ordering pulse BURST_ORDER[5] in response to the value of the third initialization information signal INITIAL_INFO2[2] or the sixth initialization information signal INITIAL_INFO2[5].

Accordingly, an operation for adjusting the values of the plurality of second initialization information signals INITIAL_INFO2[0:N] is performed so that the points in time when the plurality of burst ordering pulses BURST_ORDER[0:N] are toggled may be adjusted, and the operation for adjusting the values of the plurality of second initialization information signals INITIAL_INFO2[0:N] is performed to designate the output order of data to be output corresponding to the size of the burst length of the semiconductor device.

In the semiconductor device that supports the burst ordering operation as illustrated in FIG. 2, the domain crossing unit 220 and the data transfer unit 260, which operate in response to the second clock 2ND_CLK, are adjacent to each other. More specifically, the plurality of second initialization information signals INITIAL_INFO2[0:N] output from the domain crossing unit 220 are directly input to the pulse generation unit 240.

In addition, the initialization information generation unit 200, which is an element for performing the plurality of operations on the plurality of address signals ADDRESS[0:M] to generate the plurality of first initialization information signals INITIAL_INFO1[0:N], is positioned before the domain crossing unit 220. This configured is positioned in this way so that a time required for the initialization information generation unit 200 to perform a plurality of operations is ensured.

More specifically, when the initialization information generation unit 100 is arranged between the domain crossing unit 120 and the pulse generation unit 140 as illustrated in FIG. 1, the initialization information generation unit 100 may normally operate, for example, only when the time required for the operation of the initialization information generation unit 100 is approximately zero. However, if the initialization information generation unit 200 is positioned before the domain crossing unit 220 as illustrated in FIG. 2 and the plurality of second initialization information signals INITIAL_INFO2[0:N] are directly input to the pulse generation unit 240, since the operation time of the initialization information generation unit 200 has no influence on the operations of the domain crossing unit 220 and the pulse generation unit 240, the burst ordering operation of the semiconductor device may be normally performed even when the operation time of the initialization information generation unit 200 is sufficiently increased.

In this way, in the semiconductor device as illustrated in FIG. 2, even when the semiconductor device operates with a high speed or a low voltage or a variation in PVT (process, voltage, and temperature) occurs, the data transfer unit 260 may normally operate.

For example, when the semiconductor device has an operation speed of approximately 2.4 Gbps and a power supply voltage VDD of approximately 0.95 V and is a DDR4 SDRAM having PVT (process, voltage, and temperature) conditions, the data transfer unit 160 abnormally operates in the configuration as illustrated in FIG. 1, but the data transfer unit 260 normally operates in the configuration as illustrated in FIG. 2.

If the embodiment of the present invention is applied as described above, when the plurality of output data signals OUT_DATA[0:N] input in a parallel manner is serialized by a burst length and is output, the burst ordering operation for setting a serialization order may be supported.

Furthermore, in the course of supporting the burst ordering operation, the point in time when the domain crossing operation is performed is delayed as compared with the point in time when a burst ordering initialization information generation operation is performed so that the burst ordering operation may be supported regardless of a variation in PVT (process, voltage, and temperature).

While the present invention has been described with respect to the specific embodiments, it will be apparent to those skilled in the art that various changes and modifications may be made without departing from the spirit and scope of the invention as defined in the following claims.

For example, the above-mentioned the embodiment has mainly described the burst ordering operation for setting the serialization order when the plurality of pieces of output data OUT_DATA[0:N] input in a parallel manner is serialized. However, the scope of the present invention may include a configuration of an operation for adjusting the output point in time of one piece of OUT_DATA based on a clock.

Furthermore, the above-mentioned the embodiment has mainly described the burst ordering operation for setting the serialization order when the plurality of output data signals OUT_DATA[0:N] input in a parallel manner is serialized by one step. However, the scope of the present invention may include a burst ordering operation for setting the serialization order when the plurality of output data signals OUT_DATA [0:N] input in a parallel manner is serialized by two or more steps. For example, the scope of the present invention may include a configuration in which a first burst ordering operation and a second burst ordering operation are performed after the plurality of output data signals OUT_DATA[0:N] input in a parallel manner are divided into OUT_DATA[0:R] of a first group corresponding to a first edge of the first clock 1ST_CLK and OUT_DATA[R+1:N] of a second group corresponding to a second edge of the first clock 1ST_CLK, wherein the first burst ordering operation is performed when the output data is serialized corresponding to a first edge of the second clock 2ND_CLK, and the second burst ordering operation is performed when the output data is serialized corresponding to a second edge of the second clock 2ND_CLK.

What is claimed is:

1. A semiconductor device comprising:
an initialization information signal generator configured to operate in response to a first clock and generate first initialization information having a value that is adjusted according to a value of an address signal that corresponds to output data;
a domain crossing unit including a plurality of pipe latches configured to receive the first initialization information in response to the first clock and output the first initialization information as second initialization information by outputting the second initialization information in response to a second clock; and
a pulse generation unit including a plurality of flip-flops configured to operate in response to the second clock and adjust a toggling point in time of a control pulse in response to the second initialization information
wherein the first clock is a clock obtained by delaying an external system clock by an internal setting operation, and the second clock is an internal clock set to have an edge synchronized with the external system clock,
wherein the initialization information signal generator is configured to perform a plurality of operations on the address signal in synchronization with the first clock and generate the first initialization information.

2. The semiconductor device of claim 1, further comprising:
a data transfer unit configured to receive the output data through an input node and transfer the output data to an output node in response to the toggling of the control pulse.

3. The semiconductor device of claim 1, wherein the domain crossing unit is configured to receive and latch the first initialization information in response to the first clock and output the latched first initialization information as the second initialization information in response to the second clock.

4. The semiconductor device of claim 1, wherein the pulse generation unit comprises:
the plurality of flip-flops connected in a chain form and operating in response to the second clock,
wherein one of the plurality of flip-flops is configured to generate the control pulse according to the second initialization information.

5. The semiconductor device of claim 4, wherein, among the plurality of flip-flops, a number of flip-flops operating is set according to a burst option representing a value of a burst length or a burst chop.

6. The semiconductor device of claim 5, wherein, among the plurality of flip-flops, the flip-flops not included in the number of flip-flops operating according to the burst option do not operate.

7. A semiconductor device comprising:
an initialization information signal generator configured to operate in response to a first clock and generate a plurality of first initialization information signals having values that are adjusted according to values of a plurality of address signals that correspond to a plurality of output data signals;
a domain crossing unit including a plurality of pipe latches configured to receive the plurality of first initialization information signals in response to the first clock as a plurality of second initialization information signals by outputting the plurality of second initialization information signals in response to a second clock; and
a pulse generation unit including a plurality of flip-flops configured to operate in response to the second clock and adjust a plurality of control pulses to be toggled at different points in time in response to the plurality of second initialization information signals
wherein the first clock is a clock obtained by delaying an external system clock by an internal setting operation, and the second clock is an internal clock set to have an edge synchronized with the external system clock, wherein the initialization information signal generator is configured to perform a plurality of operations on the plurality of address signals in synchronization with the first clock and generate the plurality of first initialization information signals.

8. The semiconductor device of claim 7, further comprising:
a data transfer unit configured to receive the plurality of output data signals through a plurality of input nodes, serialize the plurality of output data signals, and transfer serialized data to one output node in response to toggling of the plurality of control pulses.

9. The semiconductor device of claim 7, wherein the domain crossing unit is configured to receive the plurality of first initialization information signals in a parallel manner in response to the first clock, latch the plurality of first initialization information signals, and output the plurality of latched first initialization information signals as the plurality of second initialization information signals in response to the second clock.

10. The semiconductor device of claim 7, wherein the pulse generation unit comprises:
the plurality of pulse output sections each including a plurality of flip-flops connected in a chain form and each operating in response to the second clock,
wherein in each of the plurality of pulse output sections, one of the plurality of flip-flops is configured to output one of the plurality of control pulses in response to one of the plurality of second initialization information signals.

11. The semiconductor device of claim 10, wherein, among the plurality of flip-flops included in the plurality of pulse output sections, a number of flip-flops operating is set according to a burst option representing a value of a burst length or a burst chop.

12. A method for operating a semiconductor device, comprising:
generating first initialization information having a value that is adjusted according to a value of an address signal that corresponds to output data and is generated in response to a first clock;
outputting the first initialization information from a plurality of pipe latches as second initialization information by synchronizing the first initialization information with a second clock; and
generating a control pulse from a plurality of flip-flops having a toggling point in time to be adjusted in response to the second initialization information and the second clock
wherein the first clock is a clock obtained by delaying an external system clock by an internal setting operation, and the second clock is an internal clock set to have an edge synchronized with the external system clock,
wherein, in the generating of the first initialization information, a plurality of operations are performed on the address signal in synchronization with the first clock so that the first initialization information is generated.

13. The method of claim 12, further comprising:
transferring the output data that is applied through an input node to an output node at a point in time when the control pulse is toggled.

14. The method of claim 12, wherein the outputting of the second initialization information comprises:
receiving and latching the first initialization information in the plurality of pipe latches in response to the first clock; and
outputting the latched first initialization information latched as the second initialization information in response to the second clock.

15. The method of claim 12, wherein, in the generating of the control pulse, the control pulse is toggled in response to toggling of the second clock by a number of adjustments corresponding to the second initialization information in an initialization operation.

* * * * *

UNITED STATES PATENT AND TRADEMARK OFFICE
CERTIFICATE OF CORRECTION

PATENT NO. : 9,324,385 B2  
APPLICATION NO. : 13/448596  
DATED : April 26, 2016  
INVENTOR(S) : Jinyeong Moon Page 1 of 1

It is certified that error appears in the above-identified patent and that said Letters Patent is hereby corrected as shown below:

On the Title Page, Item (54) and in the Specification, Column 1, Change the Title section as follows:

SEMICONDUCTOR DEVICE FOR GENERATING INITIALIZATION INFORMATION IN RESPONSE TO A FIRST CLOCK AND OUTPUTTING THE INITIALIZATION INFORMATION IN RESPONSE TO A SECOND CLOCK

Signed and Sealed this  
Twenty-first Day of June, 2016

Michelle K. Lee  
*Director of the United States Patent and Trademark Office*